(12) United States Patent
Kang

(10) Patent No.: US 8,040,725 B2
(45) Date of Patent: Oct. 18, 2011

(54) FLASH MEMORY DEVICE AND METHOD FOR ADJUSTING READ VOLTAGE OF FLASH MEMORY DEVICE

(75) Inventor: Dong-Ku Kang, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 292 days.

(21) Appl. No.: 12/146,549

(22) Filed: Jun. 26, 2008

(65) Prior Publication Data

US 2009/0003058 A1 Jan. 1, 2009

(30) Foreign Application Priority Data

Jun. 28, 2007 (KR) .................. 10-2007-0064547

(51) Int. Cl.
*G11C 16/26* (2006.01)
(52) U.S. Cl. ............................. 365/185.03; 365/210.11
(58) Field of Classification Search .............. 365/185.03, 365/185.09, 185.2, 185.22, 185.24, 189.07, 365/210.11
See application file for complete search history.

(56) References Cited

U.S. PATENT DOCUMENTS

| | | | |
|---|---|---|---|
| 6,839,280 B1 * | 1/2005 | Chindalore et al. | 365/185.18 |
| 2005/0162913 A1 * | 7/2005 | Chen | 365/185.18 |
| 2007/0002632 A1 * | 1/2007 | Okayama et al. | 365/185.24 |
| 2007/0234183 A1 * | 10/2007 | Hwang et al. | 714/763 |
| 2007/0291556 A1 * | 12/2007 | Kamei | 365/189.09 |
| 2008/0175055 A1 * | 7/2008 | Kim | 365/185.11 |

FOREIGN PATENT DOCUMENTS

| | | |
|---|---|---|
| JP | 2002-184191 | 6/2002 |
| JP | 2006-114078 | 4/2006 |
| KR | 1020010061457 | 7/2001 |

* cited by examiner

*Primary Examiner* — Van Thu Nguyen
*Assistant Examiner* — Douglas King
(74) *Attorney, Agent, or Firm* — Volentine & Whitt, PLLC

(57) ABSTRACT

A flash memory device includes a cell array and a read voltage adjuster. The cell array includes a first field having first memory cells and a second field having second memory cells. The read voltage adjuster determines a read voltage for reading first data from the first memory cells of the first field with reference to second data read from the memory cells of the second field.

31 Claims, 10 Drawing Sheets

Fig. 4

| Number of Fail Bit \ Vrd' | ~8 bits (~1 byte) | 9~40 bits (1 byte~5 bytes) | 41~160 bits (5 bytes~20 bytes) | More than 161 bits (20 bytes~) |
|---|---|---|---|---|
| Vrd1' | Vrd1-$\Delta V_{11}$ | Vrd1-$\Delta V_{12}$ | Vrd1-$\Delta V_{13}$ | Vrd1-$\Delta V_{14}$ |
| Vrd2' | Vrd2-$\Delta V_{21}$ | Vrd2-$\Delta V_{22}$ | Vrd2-$\Delta V_{23}$ | Vrd2-$\Delta V_{24}$ |
| Vrd3' | Vrd3-$\Delta V_{31}$ | Vrd3-$\Delta V_{32}$ | Vrd3-$\Delta V_{33}$ | Vrd3-$\Delta V_{34}$ |

$$\begin{cases} \Delta V_{11} < \Delta V_{21} < \Delta V_{31}, \\ \Delta V_{12} < \Delta V_{22} < \Delta V_{32}, \\ \Delta V_{13} < \Delta V_{23} < \Delta V_{33}, \\ \Delta V_{14} < \Delta V_{24} < \Delta V_{34} \end{cases}$$

FLASH MEMORY DEVICE AND METHOD FOR ADJUSTING READ VOLTAGE OF FLASH MEMORY DEVICE

CROSS-REFERENCE TO RELATED APPLICATION

A claim of priority is made to Korean Patent Application No. 10-2007-0064547, filed on Jun. 28, 2007, the subject matter of which is hereby incorporated by reference.

BACKGROUND

The present invention disclosed herein relates to semiconductor memory devices. More particularly, the present invention relates to a flash memory device capable of adjusting a read voltage.

Semiconductor memory devices are generally classified as volatile or nonvolatile memories with respect to data storage. Volatile memories operate at a high frequency, but have a disadvantage with respect to data retention because they lose data without power. In contrast, nonvolatile memories are useful because they maintain data regardless of whether power is supplied. Nonvolatile semiconductor memories include, for example, read-only memories (ROMs), mask ROMs (MROMs), programmable ROMs (PROMs), erasable and programmable ROMs (EPROMs), and electrically erasable and programmable ROMs (EEPROMs).

MROMs, PROMs and EPROMs are ordinarily regarded as inconvenient by general users with respect to updating contents because of difficulties in erasing and writing data. EEPROMs, however, are increasingly employed as subsidiary storage devices or system-programming tools, which require periodic or continuous updates, because they are able to electrically erase and write data. Flash EEPROMs, in particular, are better than conventional EEPROMs with respect to integration density, and may therefore be advantageously used as high-capacity subsidiary storage units. NAND type flash EEPROMs (hereinafter, referred to as "NAND flash memories") are typically superior to other types of flash EEPROMs with respect to integration density.

A flash memory device is a kind of integrated circuit capable of storing information and reading out information, if necessary. The flash memory device includes multiple memory cells that are rewritten with data. Each memory cell may store one-bit data or multi-bit data. In the case of storing one-bit data in a unit memory cell, the memory cell is conditioned in one of two possible threshold-voltage distributions, i.e., one of two data states "1" and "0". By comparison, in the case of storing two-bit data in a unit memory cell, the memory cell is conditioned in one of four possible threshold-voltage distributions. Further, in the case of storing three-bit data in a unit memory cell, the memory cell is conditioned in one of eight threshold-voltage distributions. Recently, studies have been directed to the possibility of storing four-bit data in a unit memory cell.

SUMMARY OF THE INVENTION

An aspect of the present invention provides a flash memory device including a cell array and a read voltage adjuster. The cell array includes a first field having a first plurality of memory cells and a second field having a second plurality of memory cells. The read voltage adjuster determines a read voltage for reading first data from the first plurality of memory cells of the first field with reference to second data read from the second plurality of memory cells of the second field.

In various embodiments, the first and second pluralities of memory cells may be connected to the same word line. The second plurality of memory cells of the second field may be programmed in a highest state. Also, the second plurality of memory cells of the second field may be sensed by an index read voltage, which may be a verifying voltage for programming the second plurality of memory cells of the second field into the highest state.

In various embodiments, the read voltage adjuster may count a number of bits corresponding to on-cells from the second data. The read voltage adjuster may also adjust the read voltage lower based on the number of bits corresponding to the on-cells.

In various embodiments, the first and second pluralities of memory cells may be multi-level cells, each multi-level cell storing multi-bit data. The cell array may further include flag cells for indicating the number of bits stored in the first and second pluralities of memory cells. The first plurality of memory cells, the second plurality of memory cells and the flag cells may be connected to the same word line.

In various embodiments, the second field may include index fields corresponding to pages of the multi-bit data. Also, the second data may be read out from the second plurality of memory cells belonging to one of the index fields in accordance with page information read by at least one flag cell. Each of the index fields may include memory cells, which are sensed by index read voltages having different levels.

In various embodiments, the flash memory device may further include a high voltage generator configured to generate the read voltage.

Another aspect of the present invention provides a flash memory device including multiple memory cells, a page buffer, a high voltage generator and a read voltage adjuster. Each of the memory cells is included in one of a main field, a spare field and an index field. The page buffer is connected to bit lines of the memory cells. The high voltage generator provides a read voltage for a word line of the memory cells. The read voltage adjuster determines the read voltage for reading first data from the memory cells of the main field with reference to second data read from the memory cells of the index field and the spare field, and for setting the high voltage generator to generate the read voltage.

In various embodiments, the memory cells may be connected to the same word line. Also, the memory cells of the spare field may include flag cells for storing page information indicating the number of pages programmed in the main field. The index field may include cell fields, each corresponding to the number of pages.

In various embodiments, the cell fields may include memory cells, which may be sensed by index read voltages having different levels, respectively. The second data may include the page information and index data read from the memory cells of the cell fields corresponding to the page information.

In various embodiments, the read voltage adjuster may count a number of bits corresponding to on-cells from the index data. The read voltage adjuster may also determine the read voltage in accordance with the counted number of bits. Further, the read voltage adjuster may adjust the read voltage to be lower based on the number of bits.

In various embodiments, the flash memory device may further include a command register and control logic block for activating the read voltage adjuster in response to a read command.

Still another aspect of the present invention provides a reading method of a multi-bit flash memory device. The method includes reading index data from memory cells belonging to an index field in response to a read command, and adjusting a read voltage with reference to the index data.

In various embodiments, the reading method may further include reading memory cells belonging to a main field using the adjusted read voltage.

In various embodiments, the memory cells of the index field may be programmed in a highest threshold-voltage state of multiple threshold-voltage states corresponding to multi-bit data. Also, the memory cells of the index field may be sensed by an index read voltage. The index read voltage may be a verifying voltage of the highest threshold-voltage state.

In various embodiments, adjusting the read voltage may include counting the number of bits corresponding to on-cells from the index data. Further, the read voltage may be adjusted lower based on the number of bits corresponding to the on-cells.

In various embodiments, the memory cells belonging to the index field and a main field may be connected to the same word line.

Further, another aspect of the present invention provides a reading method of a multi-bit flash memory device. The method includes reading page information from flag cells in response to a read command; reading index data from memory cells belonging to one of multiple index fields in accordance with the page information; adjusting a read voltage with reference to the index data; and reading memory cells belonging to a main field using the adjusted read voltage.

In various embodiments, the flag cells and the memory cells belonging to the index and main fields may be connected to the same word line. The flag cells may indicate a number of fail bits of the memory cells belonging to the main field. Also, the flag cells may include at least a second flag cell indicating whether a second page is programmed, a third flag cell indicating whether a third page is programmed, and a fourth flag cell indicating whether a fourth page is programmed.

In various embodiments, the multiple index fields may include a second index field corresponding to the second page, a third index field corresponding to the third page, and a fourth index field corresponding to the fourth page. Also, the memory cells of the second index field may be sensed by a second index read voltage, the memory cells of the third index field may be sensed by a third index read voltage, and the memory cells of the fourth index field may be sensed by a fourth index read voltage. The second through fourth read voltages may be verifying voltages for highest states corresponding to the pages.

In various embodiments, adjusting the read voltage may include counting a number of bits corresponding to on-cells from index data. The read voltage may be adjusted lower in accordance with the number of bits corresponding to the on-cells.

Another aspect of the present invention provides a memory system including a flash memory device and a memory controller configured to control the flash memory device. The flash memory device is configured to include a cell array, including a first field having a first plurality of memory cells and a second field having a second plurality of memory cells; and a read voltage adjuster, for determining a read voltage for reading first data from the first plurality of memory cells of the first field with reference to second data read from the second plurality of memory cells of the second field.

Another aspect of the present invention also provides a memory system including a flash memory device and a memory controller configured to control the flash memory device. The flash memory device is configured to include multiple memory cells, a page buffer, a high voltage generator and a read voltage adjuster. Each of the memory cells is included in one of a main field, a spare field and an index field. The page buffer is connected to bit lines of the memory cells. The high voltage generator provides a read voltage for a word line of the memory cells. The read voltage adjuster determines the read voltage for reading first data from the memory cells of the main field with reference to second data read from the memory cells of the index field and the spare field, and for setting the high voltage generator to generate the read voltage.

Another aspect of the present invention provides an information processing system including a memory system and a computing system, including the memory system as a storage device. The memory system is configured to include a flash memory device and a memory controller configured to control the flash memory device. The flash memory device includes a cell array, including a first field having a first plurality of memory cells and a second field having a second plurality of memory cells; and a read voltage adjuster, for determining a read voltage for reading first data from the first plurality of memory cells of the first field with reference to second data read from the second plurality of memory cells of the second field.

Another aspect of the present invention also provides an information processing system including a memory system and a computing system, which includes the memory system as a storage device. The memory system is configured to include a flash memory device and a memory controller configured to control the flash memory device. The flash memory device includes multiple memory cells, a page buffer, a high voltage generator and a read voltage adjuster. Each of the memory cells is included in one of a main field, a spare field and an index field. The page buffer is connected to bit lines of the memory cells. The high voltage generator provides a read voltage for a word line of the memory cells. The read voltage adjuster determines the read voltage for reading first data from the memory cells of the main field with reference to second data read from the memory cells of the index field and the spare field, and for setting the high voltage generator to generate the read voltage.

A further description of the nature and advantages of the various embodiments of the present invention is provided below with reference to the attached figures.

BRIEF DESCRIPTION OF THE FIGURES

Non-limiting and non-exhaustive embodiments of the present invention will be described with reference to the attached drawings, in which like reference numerals refer to like parts, unless otherwise specified. In the drawings:

FIG. 4 is a table showing examples of read voltage groups based on the number of fail bits generated by reading an index field, according to an exemplary embodiment of the present invention;

DETAILED DESCRIPTION OF THE EMBODIMENTS

Figure 1:
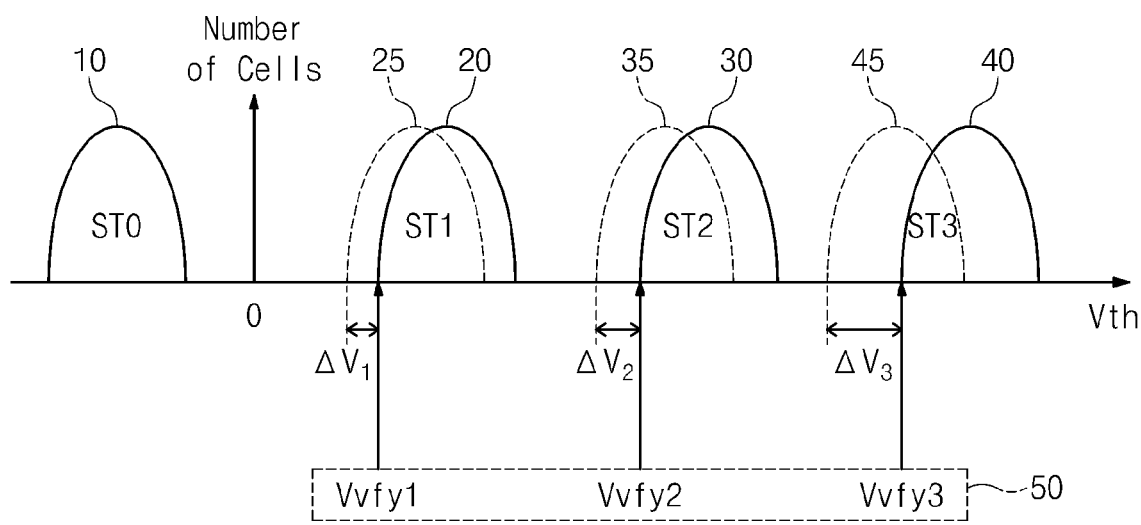
FIG. 1 is a graphic diagram showing an effect due to charge loss from multi-bit flash memory cells.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements and techniques are not described with respect to some of the embodiments of the present invention. Throughout the drawings and written description, like reference numerals will be used to refer to like or similar elements.

Throughout this description, hot temperature stress (HTS) is provided as an example of a generic cause of losing charges injected into a floating gate of a flash memory cell. However, it is understood that HTS is just one of many potential causes for inducing charge loss. Further, a NAND flash memory device is used as a model for describing and illustrating features and functions according to various embodiments of the present invention.

Exemplary embodiments of the present invention will be described in conjunction with the accompanying drawings. The embodiments are directed to multi-bit flash memory devices capable of minimizing read errors, as well as methods for adjusting read voltages in multi-bit flash memory devices.

FIG. 1 is a graphic diagram showing variations of threshold-voltage distributions by charge loss, for example, due to hot temperature stress (HTS) from multi-bit flash memory cells. FIG. 1 shows target threshold-voltage distributions 10, 20, 30 and 40, which are formed by normal programming operations, and abnormal threshold-voltage distributions 25, 35 and 45, which are caused by HTS. For first state ST1 of the threshold voltages, memory cells are programmed by verifying voltage Vvfy1. For second state ST2, memory cells are programmed by verifying voltage Vvfy2. For third state ST3, memory cells are programmed by verifying voltage Vvfy3. After programming the target distributions 20, 30 and 40, electrons injected into floating gates of the memory cells may leak (or be lost) due to HTS. Due to leakage of electrons injected into the floating gates, the threshold voltages of the memory cells are shifted to the distributions 25, 35 and 45, respectively, from the target distributions 20, 30 and 40. Generally, read voltages for retrieving data from the memory cells are fixed at constant levels, even with the shift of the threshold-voltage distributions. Therefore, it is necessary to appropriately shift the read voltages in order to compensate for the shifted threshold-voltage distributions, e.g., due to the effects of HTS.

The degree or rate of shifting the threshold voltages varies according to positions of the threshold voltages. In particular, under the same HTS conditions, the threshold-voltage distribution 40 moves to the threshold-voltage distribution 45, the threshold-voltage distribution 30 moves to the threshold-voltage distribution 35, and the threshold-voltage distribution 20 moves to the threshold-voltage distribution 25. There may be differences in shifting rates among the threshold-voltage distributions. For instance, the threshold-voltage distributions 40 and 45 corresponding to third state ST3 differ from each other by voltage gap $\Delta V_3$. The threshold-voltage distributions 30 and 35 corresponding to second state ST2 differ from each other by voltage gap $\Delta V_2$. Likewise, the threshold-voltage distributions 20 and 25 corresponding to first state ST1 differ from each other by voltage gap $\Delta V_1$. The voltage gaps $\Delta V_1$, $\Delta V_2$ and $\Delta V_3$ may likewise differ from one another. Thus, the respective read voltages 50 (Vvfy3, Vvfy2 and Vvfy1) are adjusted in accordance with the voltage gaps between the target distributions and the current distributions. Additionally, there may also be differences in electron leakage from the floating gates by degree of HTS. Accordingly, embodiments of the present invention enable detection of the degree of HTS and selection of a rate of adjusting the read voltage with reference to the detected HTS degree.

Figure 2:
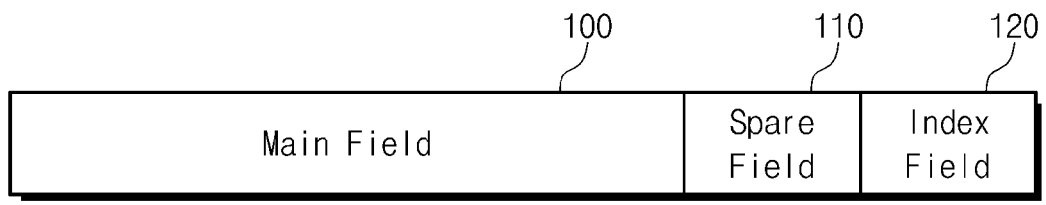
FIG. 2 is a diagram showing composition of memory fields, according to an exemplary embodiment of the present invention.

FIG. 2 is a diagram showing the composition of memory fields, according to an exemplary embodiment of the present invention. Based on quantization of charge loss rate due to HTS by allocating memory cells to the fields of FIG. 2, e.g., in word line or memory block units, the read voltages may be adjusted in accordance with the quantized HTS degree. Referring to FIG. 2, the memory cells are in a main field 100, a spare field 110 and an index field 120. The memory cells of the main field 100 are programmed with externally provided data. The memory cells of the spare field 110 store control information regarding the data stored in the main field 100. In particular, in the flash memory device according to an exemplary embodiment of the present invention, the spare field 110 includes flag cells. The flag cells function to instruct multi-bit flash memory cells on the number of programmed bits. Data stored in the flag cells may be referred to as "page information."

The cell array of the flash memory device according to the exemplary embodiment also includes memory cells corresponding to the index field 120. The memory cells included in the index field 120 are programmed to the highest threshold-voltage state among the multi-bit data programmed in the main field 100. During a reading operation, the memory cells of the index field 120 are read in response to the read voltage corresponding to an HTS index level (HIL). The HIL can be selected by a verifying voltage of the highest threshold-voltage state. Data read out from the index field 120 may be referred to as "index data." From the index data, a degree of charge loss may be quantized by counting the number of bits (logically "1") corresponding to on-cells. The resolution for the charge loss quantization that can be obtained is based on the number of memory cells included in the index field 120. In an exemplary embodiment, the index field 120 may include memory cells capable of forming a curve corresponding to a threshold-voltage distribution. For example, memory cells of 16 or 32 bytes may be allocated to the index field 120.

The allocation of the memory fields may be applied to memory cells connected to a single word line, or memory cells included in a memory block. For simplicity of description, the depicted exemplary embodiment is shown in the configuration of memory cells connected to a single word line allocated to the main field 100, the spare field 110 and the index field 120.

Figure 3:
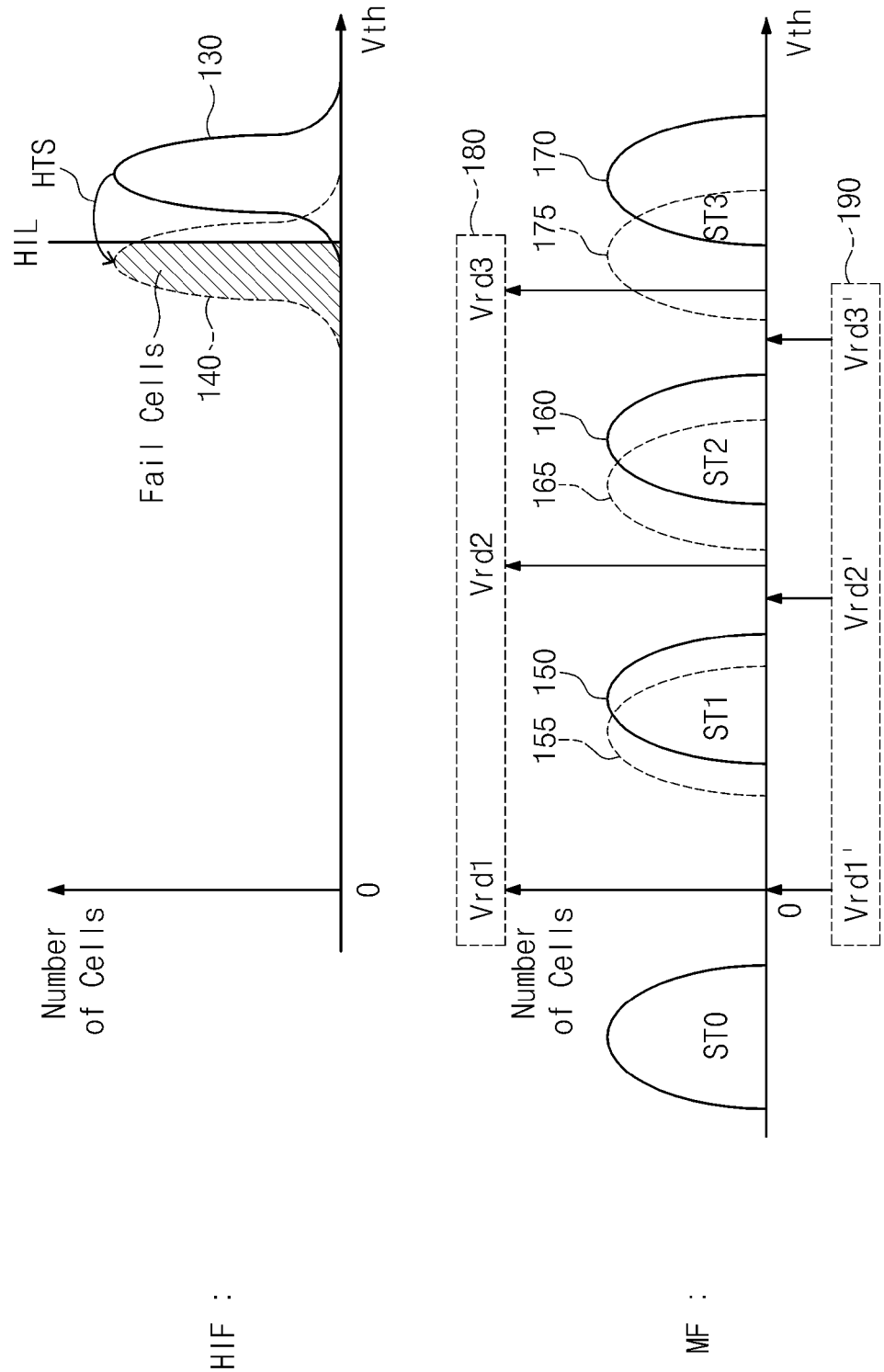
FIG. 3 is a graphic diagram showing adjusting read voltages while reading an index field, according to an exemplary embodiment of the present invention.

FIG. 3 is a graphic diagram showing an adjustment of read voltages Vrd while reading the index field 120 (HIF), according to an exemplary embodiment of the present invention. Referring to FIG. 3, each of the memory cells belonging to the index field HIF is programmed to the highest state, forming a corresponding threshold-voltage distribution 130. The memory cells belonging to the main field 100 (MF) are conditioned to have a threshold-voltage distribution corresponding to an erased state ST0 or one of threshold-voltage distributions 150, 160 or 170 by a programming operation with multi-bit data.

However, due to HTS, the threshold-voltage distribution 130 of the memory cells of the index field HIF may shift toward threshold-voltage distribution 140. After HTS occurs, threshold voltages of the memory cells of the main field MF are respectively shifted to distributions 155, 165 and 175. If the main field MF is read by the read voltages 180 (Vrd1, Vrd2 and Vrd3), which have not yet been adjusted, the memory cells included in the threshold-voltage distribution 175, in particular, may be partly read, with failures. In other words, when the non-adjusted read voltage Vrd3 is used for sensing the memory cells of the main field MF, data read out from the memory cells of the third state ST3 may include errors. When adjusted read voltages 190 (Vrd1', Vrd2' and Vrd3') are used for sensing the memory cells of the main field MF, the memory cells of the main field MF can be sensed without errors or failures. Adjusting the default read voltages 180 (Vrd1~Vrd3) to the adjusted read voltages 190 (Vrd1'~Vrd3') compensates for the adverse effects caused by HTS. This adjustment to the read voltages 190 may be conducted by reading the index field HIF and counting fail bits.

Sensing the memory cells of the index field HIF is performed using an index read voltage corresponding to the HIL. From the index data, the number of bits corresponding to on-cells (i.e., fail bits) may be counted. The memory cells corresponding to the fail bits are indicated by the hatched portion of the threshold-voltage distribution 140, which are below the HIL. A level of the corresponding adjusted read voltage is determined by the number of fail bits. After determining the amount by which to adjust the read voltages based on the number of fail bits, a high voltage generator (not shown) may be set to generate the adjusted read voltages 190 (Vrd1'~Vrd3'). The reading operation is then performed for the memory cells of the main field MF using the adjusted read voltages 190.

The read voltages can be adjusted in accordance with the reading operation of the index field HIF and the counted number of fail bits. A degree of charge loss can be quantized in real time by the reading operation of the index field HIF. Then, read errors may be minimized in the reading operation of the main field using the adjusted read voltages 190.

FIG. 4 is a table showing examples of the number of fail bits counted after reading the index field HIF and the adjusted read voltage levels corresponding to the number of fail bits, according to an exemplary embodiment of the present invention. Referring to FIG. 4, the number of fail bits is counted after the reading operation of the memory cells in the index field HIF. Then, according to the counted result, a level of the adjusted read voltage is determined. The table of FIG. 4 shows an example including two-bit memory cells (2-bit MLCs), shown in FIG. 3. For purposes of explanation, it is assumed that the number of memory cells included in the index field HIF corresponds to 32 bytes.

Through the reading operation of the index field HIF, the number of fail bits generated due to charge loss (or charge leakage) is counted. The adjusted read voltages Vrd1', Vrd2' and Vrd3', respectively corresponding to the shifted threshold-voltage distributions 155, 165 and 175, are determined in accordance with the number of fail bits. If there is no detection of the fail-bit number or if the detected number of fail bits is less than a reference value, the read voltages are not adjusted.

As shown in FIG. 4, when the number of fail bits is detected in the range of 1 through 8 bits, the read voltages corresponding to the threshold-voltage states are adjusted to be lower than the default read voltages Vrd1, Vrd2 and Vrd3 by first predetermined adjusting levels $\Delta V_{11}$, $\Delta V_{21}$, and $\Delta V_{31}$, respectively. When the number of fail bits is detected in the range of 9 through 40 bits, the read voltages corresponding to the threshold-voltage states are adjusted to be lower than the default read voltages Vrd1, Vrd2 and Vrd3 by second predetermined adjusting levels $\Delta V_{12}$, $\Delta V_{22}$, and $\Delta V_{32}$, respectively. When the number of fail bits is detected in the range of 41 through 160 bits, the read voltages corresponding to the threshold-voltage states are adjusted to be lower than the default read voltages Vrd1, Vrd2 and Vrd3 by third predetermined adjusting levels $\Delta V_{13}$, $\Delta V_{23}$, and $\Delta V_{33}$, respectively. When the number of fail bits is detected as being greater than 161 bits (20 bytes), the read voltages corresponding to the threshold-voltage states are adjusted to be lower than the default read voltages Vrd1, Vrd2, and Vrd3 by predetermined fourth adjusting levels $\Delta V_{14}$, $\Delta V_{24}$, and $\Delta V_{34}$, respectively. In an embodiment, the read voltages corresponding to the higher threshold voltages have higher adjusting levels. For instance, the first adjusting levels relate to one another as follows: $\Delta V_{11} < \Delta V_{21} < \Delta V_{31}$.

It is understood that the dimensions and units discussed above with respect to the adjusting levels of the read voltages and the number of fail bits, as shown in FIG. 4, are examples for purposes of explaining an exemplary embodiment of the present invention. The grouping patterns of the read voltages corresponding to the adjusting levels may be modified, for example, based on the number of programmed pages.

Figure 5:
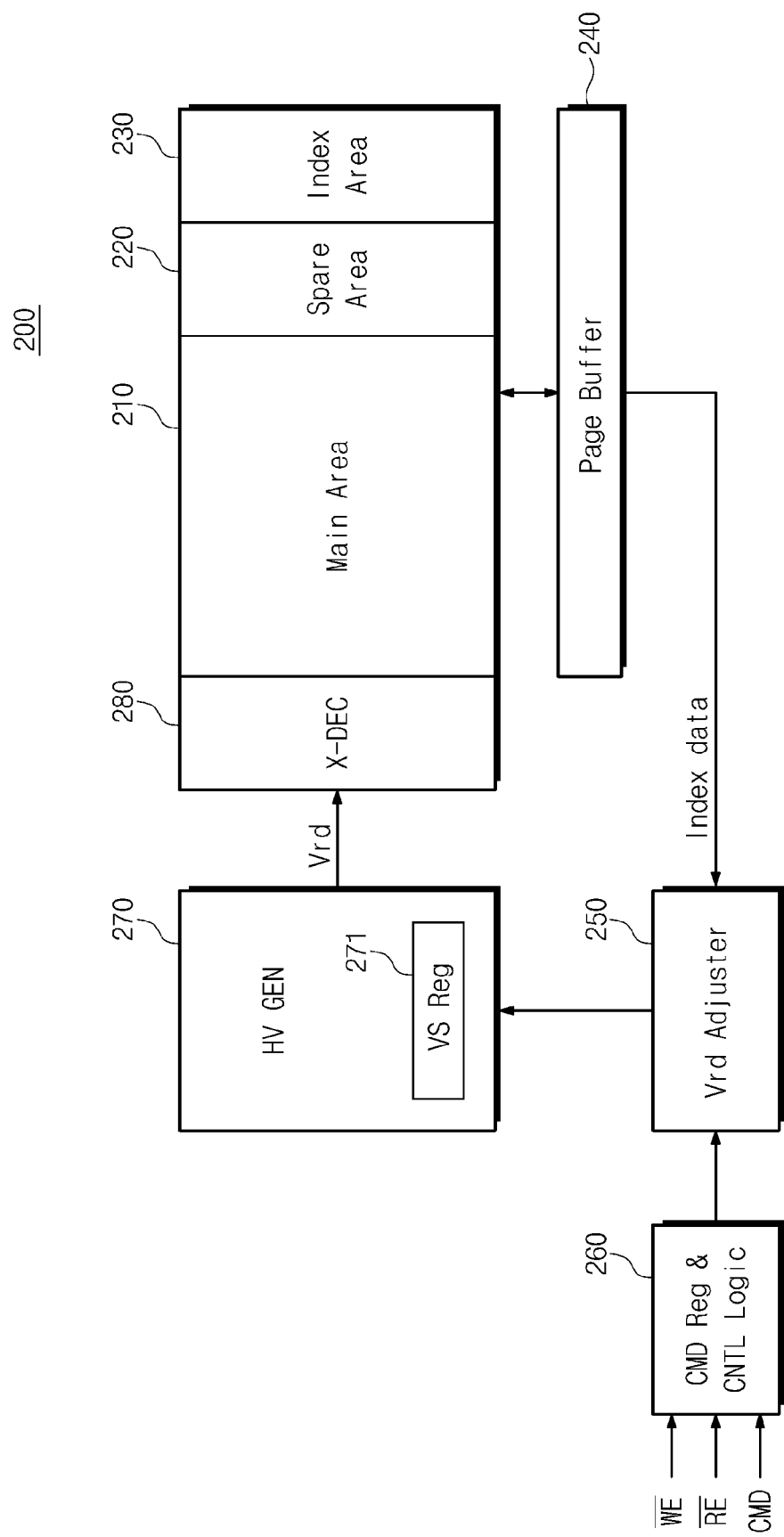
FIG. 5 is a block diagram of the flash memory device, according to an exemplary embodiment of the present invention.

FIG. 5 is a block diagram of a flash memory device, according to an exemplary embodiment of the present invention. Referring to FIG. 5, a read voltage adjuster 250 sets optimum levels of read voltages for sensing the memory cells of the main field MF with reference to data read from the index field HIF, as discussed below.

The flash memory device 200 includes a cell array for storing data, divided into a main area 210, a spare area 220 and an index area 230 (e.g., respectively corresponding to the main field 100, the spare field 110 and the spare field 120 shown in FIG. 2). The areas 210, 220 and 230 are sectored with reference to column addresses. The main area 210 stores externally provided data. In a general NAND flash memory, for example, multiple memory cells are connected to a single word line in series. HTS usually forces threshold voltages of the memory cells to shift downward. The spare area 220 stores control information, such as bad block data or error correction data (ECC data). More particularly, the spare area 220 includes flag cells, which are arranged to correspond to the word lines and which store page information by the corresponding word lines. For example, for a multi-bit memory cell structure, a unit memory cell stores multiple bits of data.

The page information indicates how many bits of data are stored in the memory cells connected to the corresponding word line. The index area 230 includes memory cells for sensing a degree of charge loss, e.g., due to HTS. The memory cells belonging to the index area 230 are programmed in the highest threshold-voltage state, so that they are first exposed to HTS. The memory cells included in the index area 230 are sensed by the HIL afterward. An HTS effect can thus be quantized and evaluated by counting the number of fail bits from read bits.

In the multi-bit flash memory device 200, the areas 210, 220 and 230 of the cell array include multi-bit cells, each of which stores m-bit data (where m is a positive integer larger than 1). In an exemplary embodiment, page data to be simultaneously programmed are written to the memory cells using the program voltage supplied to a unit word line. During the reading operation, page data stored in the memory cells connected to a unit word line are sensed and latched by a page buffer 240, while the read voltage is being supplied to the word line. Thus, the smallest unit by which read voltages may be adjusted corresponds to a word line. The read voltages are each selected for the word lines in optimum condition. The word lines may be divisionally allocated to even and odd pages, and the read voltages may be provided independently for the even and odd pages. As a unit multi-bit memory cell is programmed with multiple bits, the read voltage adjustment can be conducted for each page of multi-bit data, according to the embodiment.

The page buffer 240 operates as a writing driver circuit or a sense amplifier circuit in accordance with an operation mode. In the programming operation, page data to be programmed in the areas 210, 220 and 230 are loaded into the page buffer 240. The loaded page data are transferred to the bit lines and programmed in the memory cells. In the reading operation, the page buffer 240 operates to sense and latch data stored in the selected memory cells of the areas 210, 220 and 230 of the cell array.

The read voltage adjuster 250 sets the optimum read voltages for the memory cells belonging to a word line or unit page included in the areas 210, 220 and 230 of the cell array. If a read command is input, a command register and control logic block 260 conducts an overall control function for the reading operation. In particular, responding to the read command, the command register and control logic block 260 sends control signals to the read voltage adjuster 250 for performing the read voltage adjustment. The read voltage adjuster 250 provides the read voltages of the HIL, for sensing the memory cells of the index area 230, in response to the control signals. Read index data are provided to the read voltage adjuster 250 by way of the page buffer 240. The read voltage adjuster 250 counts the number of fail bits with reference to the index data transferred thereto. The number of fail bits corresponds to the number of memory cells having threshold voltages lower than the HIL, as shown in FIG. 3.

The read voltage adjuster 250 selects read voltages with reference to the counted number of fail bits. The read voltage adjuster 250 includes read-voltage groups selected by the number of fail bits. Each read-voltage group includes adjusted read-voltage information corresponding to each threshold-voltage state or distribution. The read voltage adjuster 250 controls the high voltage generator 270 to generate a selected one of the read voltages. After the read voltages are adjusted by the high voltage generator 270, the reading operation begins to sense the memory cells of the main area 210 using the adjusted read voltages. During this reading operation, data read from the main area 210 are externally output by way of an input/output buffer (not shown).

The command register and control logic block 260 provides the control signals for activating the read voltage adjuster 250 in response to the read command input from an external system (e.g., a memory controller) of the flash memory device 200. In compliance with the control signals, the read voltage adjuster 250 senses the memory cells of the index area 230 (i.e., HIF) and adjusts the read voltages of the high voltage generator 270 with reference to the sense results.

The high voltage generator 270 provides word line voltages to the cell array composed of the areas 210, 220 and 230. The high voltage generator 270 selectively supplies the word line voltages with various levels to the word lines in accordance with operation modes. During the programming operation, the high voltage generator 270 provides the program voltage Vpgm to a selected word line. During the reading operation, the high voltage generator 270 provides the read voltage Vrd for reading a selected page coupled to a selected word line. In particular, the high voltage generator 270, according to an exemplary embodiment of the present invention, is able to provide a selected word line with the read voltage specified for the word line. According to a result of reading the index area 230 (or the index field HIF), the high voltage generator 270 is set to generate the read voltages individually adjusted by the pages of the word lines. The high voltage generator 270 is able to supply the optimum read voltage to each word line. Additionally, the high voltage generator 270 is able to supply the optimum read voltage, which corresponds to the pages for a unit word line.

In order to provide the optimum read voltage to the pages for each word line, the high voltage generator 270 includes a set register 271. The set register 271 stores set data for creating the optimum read voltages for the word lines. The set data stored in the set register 271 are prepared for the optimum read voltages, each of which corresponds to the pages of the word lines, respectively. The set data are generated from the read voltage adjuster 250 and obtained from results of reading the index area 230. While reading the index area 230 for setting the optimum read voltages, the high voltage generator 270 supplies the read voltages of high resolution.

The row decoder 280 selects the word lines in response to row addresses. The row decoder 280 further transfers the read voltage (or word line voltage) to a selected word line.

With the structure described above, the flash memory device 200, according to the depicted embodiment of the present invention, is able to provide read voltages optimized to the pages of the word lines. By setting the optimum read voltages, the flash memory device 200 is able to reduce or minimize read errors in the reading operation.

Figure 6:
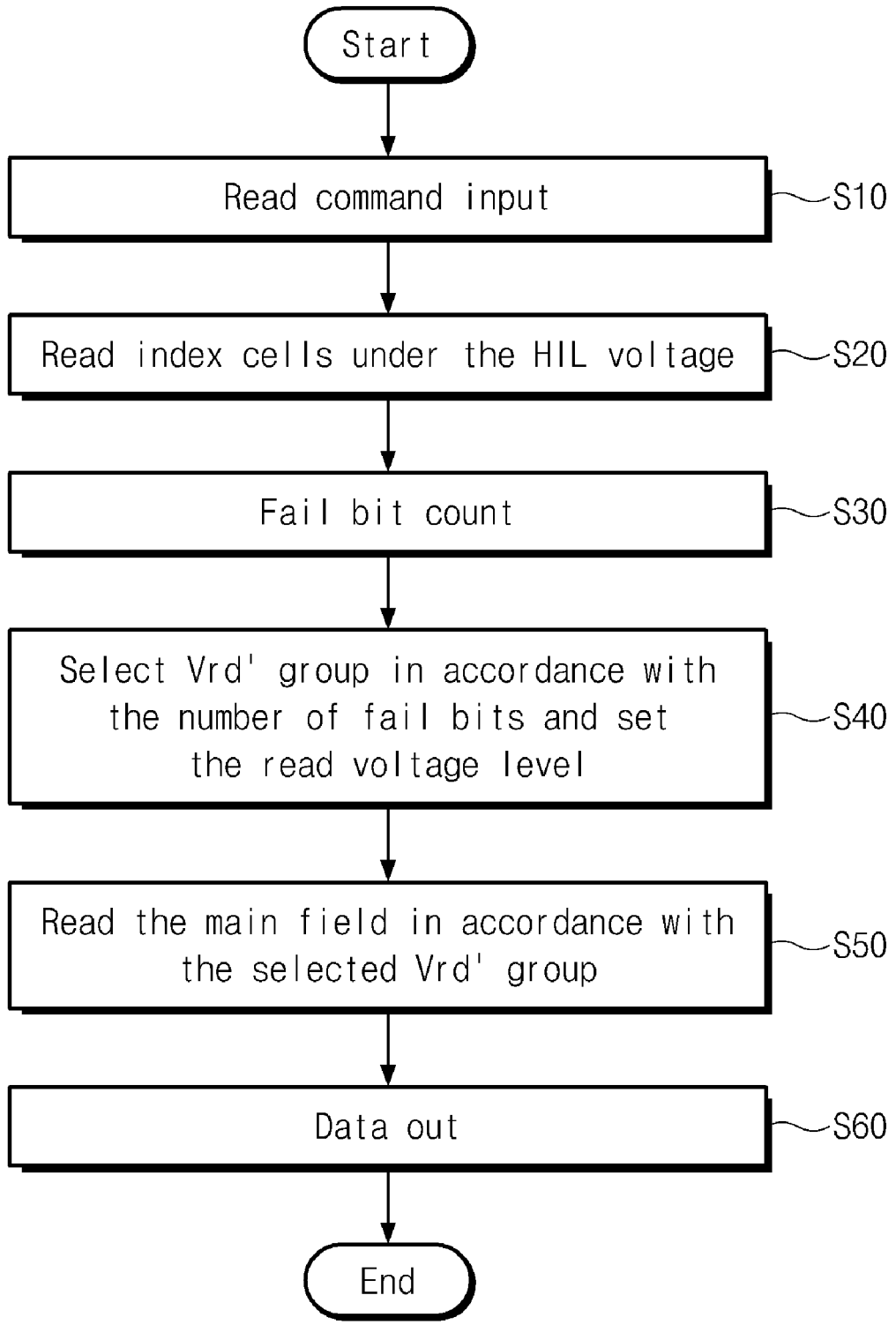
FIG. 6 is a flow chart showing a method for adjusting read voltages, according to an exemplary embodiment of the present invention.

FIG. 6 is a flow chart showing a method for adjusting the read voltage by the read voltage adjuster 250 of FIG. 5, according to an exemplary embodiment of the present invention. FIG. 6 shows the reading operation for the index area 230 (or the index field HIF) by the read voltage adjuster 250 and the set operation by the set register 271 of the high voltage generator 250. The read voltage adjuster 250 finds a degree of charge loss due to HTS by conducting the reading operation of the index area 230, and adjusts the read voltages in accordance with the degree of charge loss. The reading operation of the index area 230 by the read voltage adjuster 250 and the set operation for the read voltages will be described in conjunction with the accompanying figures.

First, a read command is input from an external system of the flash memory device 200 (S10). In response to the read command, the command register and control logic block 260 generates and transfers control signals to the read voltage adjuster 250, which begins to adjust the read voltages in response to the control signals. The read voltage adjuster 250 conducts the reading operation to the index area 230 (or the index field HIF) with reference to the index level HIL (S20). Data stored in the memory cells of the index area 230 (i.e., index cells) are sensed and latched by the page buffer 240. The read command may be a read command for a unit page, for example. Thus, the page buffer 240 will also sense and latch data from the main area 210 (or the main field MF) of a selected page. The read voltage adjuster 260 selects only index data sensed and latched from the memory cells of the index area 230.

The read voltage adjuster 250 counts the number of fail bits with reference to the index data input thereto (S30). The fail bits are generated in proportion to a degree of charge loss due to HTS, corresponding to the memory cells having lower threshold voltages than the index level HIL. Thus, counting the fail bits amounts to an operation for counting the number of on-cells included in the index data, i.e., the number of logical "1s".

From counting the number of fail bits, the read voltage adjuster 250 selects the read voltages corresponding to the threshold-voltage states or distributions with reference to the number of fail bits. In general, as shown in the table of FIG. 4, the read voltage adjuster 250 is able to select groups of read voltages adjusted with reference to the number of fail bits. Also, the read voltage adjuster 250 sets the high voltage generator 270 to generate a selected one of the read voltages (S40). For example, the set register 271 of the high voltage generator 270 receives a code for creating the selected read voltage. After adjusting the read voltages, reading a page corresponding to the first read command is performed for the main area 210 (S50). After reading the main area 210, read data latched in the page buffer 240 are externally output (S60).

Through the reading operation, the memory cells of the index field are sensed by the index level HIL as index data. From the index data, fail bits are counted to evaluate variations of the threshold voltages due to HTS. Then, the read voltages are adjusted to correspond to the evaluated values, and main data are read out from the main field using the adjusted read voltages. This reading operation helps to reduce or minimize read errors.

Figure 7:
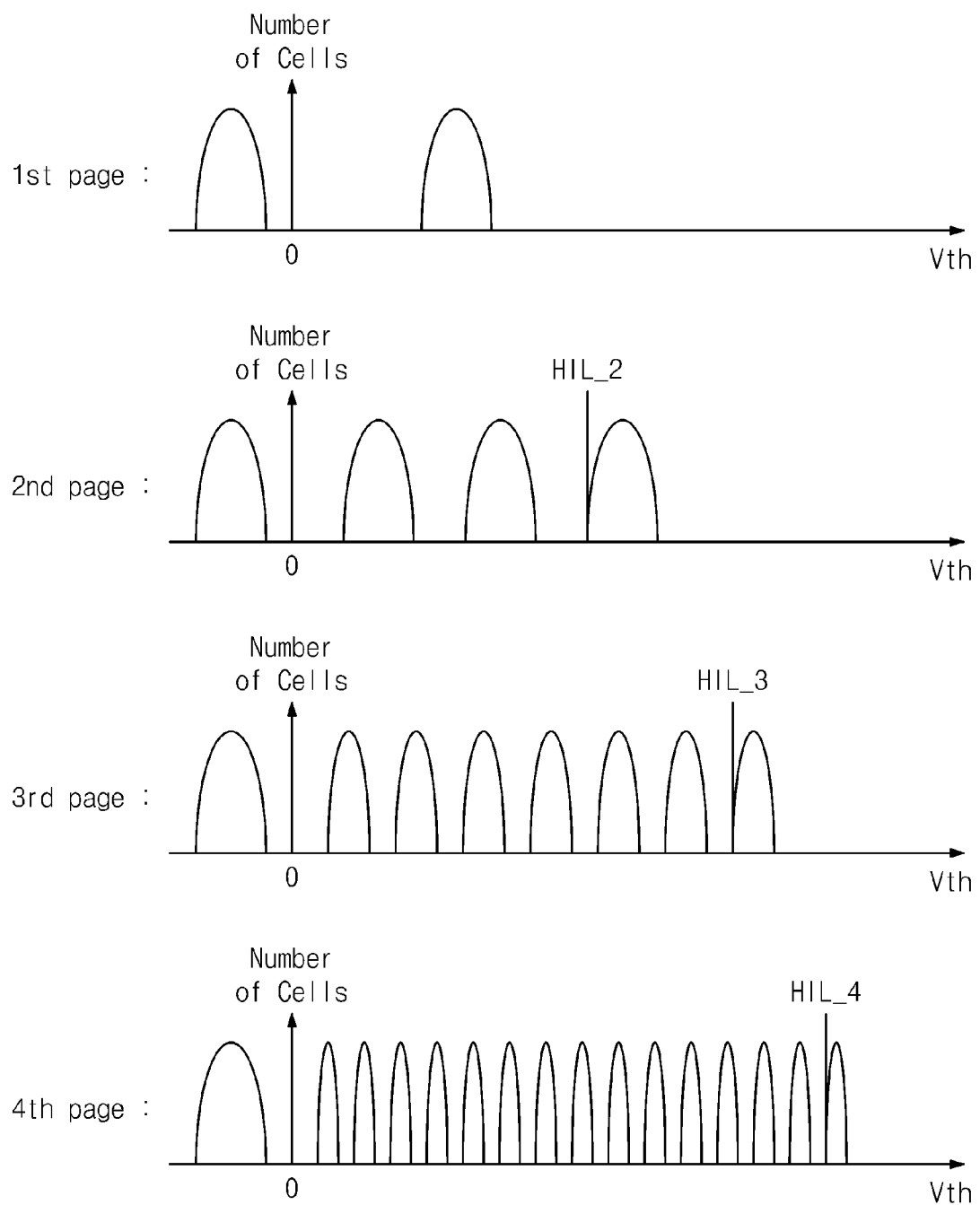
FIG. 7 shows graphic diagrams of index levels corresponding to pages, according to an exemplary embodiment of the present invention.

FIG. 7 shows threshold-voltage distributions after programming a multi-bit flash memory device (e.g., a four-bit flash memory device). Referring to FIG. 7, the memory cells of the four-bit flash memory device are conditioned differently from each other by page. Likewise, the memory cells have threshold-voltage windows and read margins by page. Thus, the memory cells included in the index field must be read on index levels different from one another by pages.

In other words, by programming one-bit data into the flash memory cells after programming a first page (the least significant bit (LSB) page), the memory cells are charged in one of two threshold-voltage states. However, after programming two-bit data (e.g., after a second page programming), the memory cells are conditioned in one of four threshold-voltage states. After programming three-bit data (e.g., after a third page programming), the memory cells arrive at one of eight threshold-voltage states. After programming four-bit data, the memory cells correspondingly result in one of sixteen threshold-voltage states or distributions. Therefore, even while programming any page, the threshold-voltage distributions are likely to shift due to charge loss from the floating gates by HTS of the memory cells. Therefore, the technology for selecting the optimum level of the read voltage by word lines can be advanced to the function of assigning the optimum read voltages by pages, as described below.

Further, the read voltage of the threshold-voltage state of the first page (corresponding to the LSB) may be adjusted or not according to the needs of a user. The shift of the threshold-voltage distribution is relatively insignificant when programming the LSB page.

After second page programming, the effects on threshold-voltage distribution by the second page programming is more conspicuous than that of the LSB page programming. Thus, by the second page programming, the memory cells are conditioned in one of four threshold-voltage states ST0, ST1, ST2 and ST3. When a read command is input, the read voltage adjuster 250 obtains page information by sensing the flag cells from the spare area 220 (or the spare field). When the page information is detected indicating that the programming operation has been carried out to the second page, the reading operation is conducted to the index area 230 (or the index field HIF) in accordance with the index level HIL_2. The read voltage adjuster 250 counts fail bits with reference to the index data read out from the index area 230. The read voltage adjuster 250 determines the optimum read voltages in accordance with the counted number of fail bits.

An HTS effect on the threshold-voltage distribution by the third page programming is more prominent than that by the second page programming. Thus, after the third page programming, the memory cells are conditioned in one of eight threshold-voltage states ST0, ST1, ST2, ST3, ST4, ST5, ST6 and ST7. When there is a read command is input, the read voltage adjuster 250 finds page information from sensing the flag cells from the spare area 220. When the page information indicates that the third page has been programmed, the read voltage adjuster 250 adjusts the read voltage for the reading operation of the index area 230 by the index level HIL_3. The read voltage adjuster 250 counts fail bits with reference to index data. The read voltage adjuster 250 also determines the optimum read voltages for reading the third page in accordance with the counted number of fail bits.

The optimum read voltages corresponding to the fourth page (the most significant bit (MSB) page) are determined by the reading operation of the index area 230 that is programmed in the highest one of the threshold-voltage states corresponding to four-bit data. An HTS effect of the threshold-voltage distribution by the fourth page programming is more prominent than that by the third page programming. Thus, after the fourth page programming, the memory cells are conditioned in one of the sixteen threshold-voltage states ST0, ST1, ST2, ST3, ST4, ST5, ST6, ST7, ST8, ST9, ST10, ST1, ST12, ST13, ST14 and ST15. When a read command is input, the read voltage adjuster 250 finds page information from sensing the flag cells from the spare area 220. When the page information indicates that the fourth page has been programmed, the read voltage adjuster 250 adjusts the read voltage for the reading operation to the index area 230 by the index level HIL_4. The read voltage adjuster 250 counts fail bits with reference to index data. The read voltage adjuster 250 also determines the optimum read voltages for reading the fourth page in accordance with the counted number of fail bits.

In an embodiment, the read voltage adjuster 250 is able to adjust the read voltages only for pages that have a high probability of errors by shifting threshold-voltage distributions. For instance, the adjustment of read voltages may be performed only for the MSB page, or the MSB and third pages. For adjusting the read voltages by pages, the set register 171 of the high voltage generator 270 must have large data storage capacity because of the large volume of set data for generating the optimum read voltage by pages of the word lines.

Figure 8:
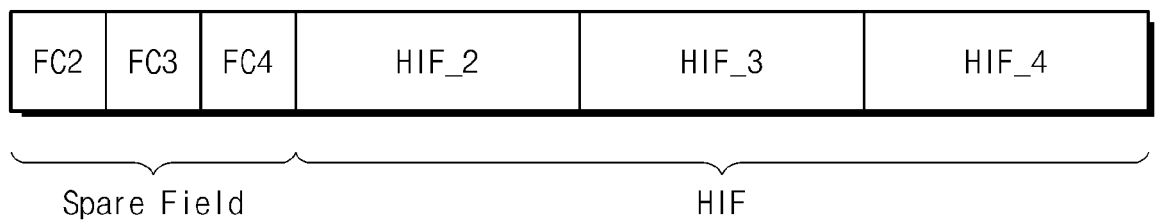
FIG. 8 is a diagram showing composition of flag cells and index fields, according to an exemplary embodiment of the present invention.

FIG. 8 is a diagram showing composition of the spare and index fields for adjusting the read voltage by pages as shown in FIG. 7, according to an exemplary embodiment of the present invention. Referring to FIG. 8, the index field HIF (or the index area 230) includes second, third and fourth index fields, HIF_2, HIF_3 and HIF_4 (HIF_2~HIF_4), for sensing HTS effects respectively from the second, third and fourth pages. Each of the index fields HIF_2~HIF_4 includes enough memory cells to form the threshold-voltage distributions. For instance, each of the index fields HIF_2~HIF_4 includes memory cells having about 16 bytes in capacity.

Along with the index fields HIF_2~HIF_4 corresponding each to the pages of multi-bit data, the spare field (or the spare area 220) includes flag cells FC2, FC3 and FC4 (FC2~FC4) corresponding respective pages. In particular, each of the flag cells FC2~FC4 stores page information. The page information is input to each of the flag cells FC2~FC4, indicating which page data of the first through fourth pages is stored therein. When a read command is input, the read voltage adjuster 250 senses a programmed page (referred to as "program page") of the main field (or the main area 210) corresponding to the page information stored in the flag cells FC2~FC4. The read voltage adjuster 250 counts the number of fail bits by reading out the index field corresponding to the detected program page.

Figure 9:
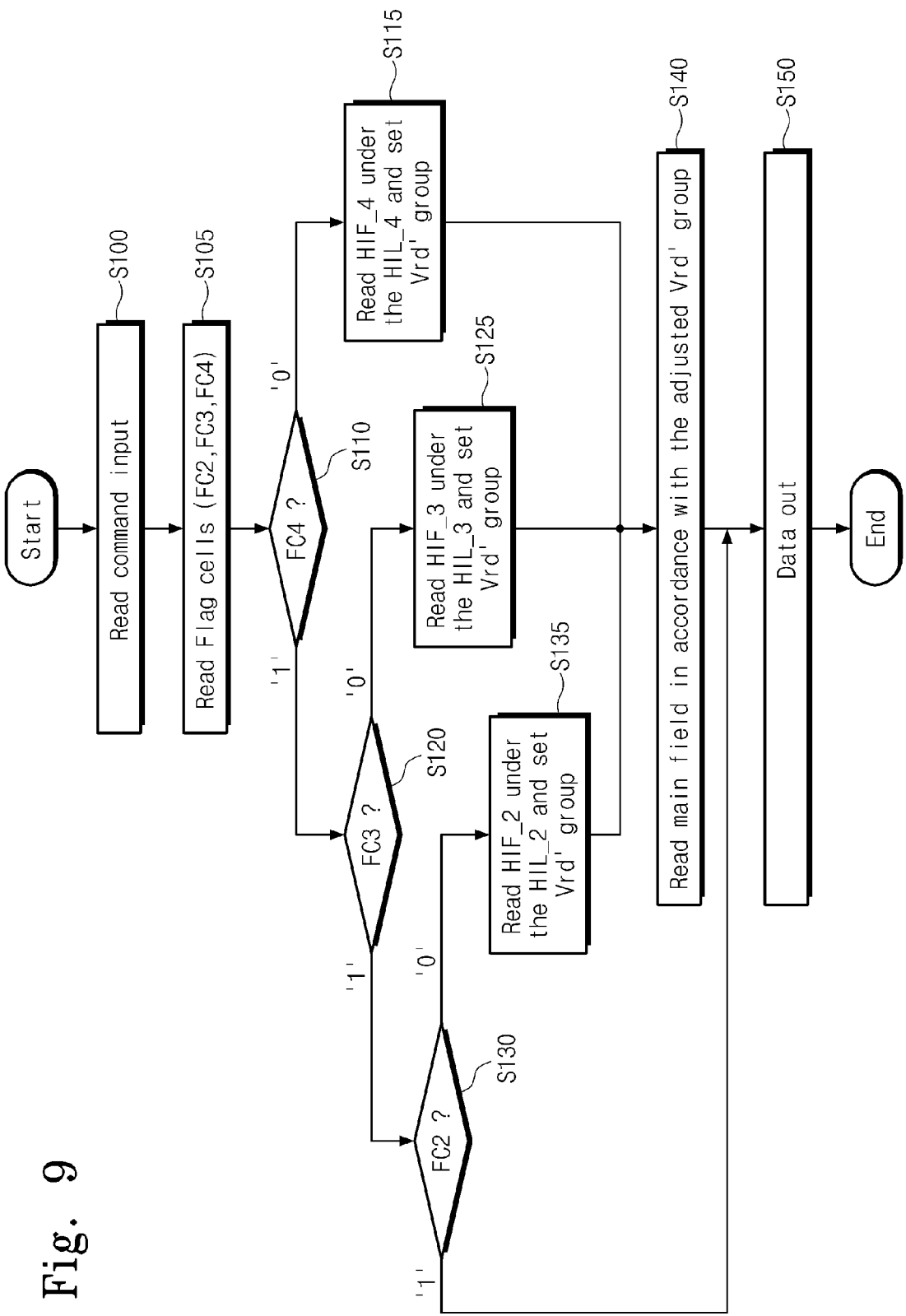
FIG. 9 is a flow chart showing a reading operation with reference to read voltage groups, according to an exemplary embodiment of the present invention.

FIG. 9 is a flow chart showing a reading operation by the read voltage generator 250, according to an exemplary embodiment of the present invention. Referring to FIG. 9, optimum read voltages are determined based on program pages of the main field and the high voltage generator 270 is set accordingly. For purposes of discussion, the optimum read voltages by pages are selected for a selected word line, skipping a step for selecting one of the word lines. The following describes operations of the read voltage adjuster 250, detecting page information, reading the index field (or the index area 230) by the page data, and selecting and setting the read voltage, with reference to the accompanying figures.

Adjusting the read voltages begins with receiving a read command from an external system of the flash memory device (S100). In response to the read command, the read voltage adjuster 250 senses the flag cells FC2~FC4 of a selected word line (S105). The read voltage adjuster 250 detects page information from the flag cells FC2~FC4 corresponding to the MSB page.

The page information stored in the flag cell FC4 is determined (S110). When the page information stored in the flag cell FC4 is "0", it means that the memory cells of the main field (or the main area 210) have been programmed up to the fourth page. Thus, the read voltage adjuster 250 executes the reading operation to the fourth index field HIF_4 in order to set the read voltage corresponding to the fourth page. For this, the page buffer 240 is reset and the memory cells of the fourth index field HIF_4 are sensed with reference to the index level HIL_4. The read voltage adjuster 250 counts fail bits from index data output based on the reading result. According to the counted number of fail bits, the optimum group of the read voltages is selected for reading the fourth page data (S115). Data of the memory cells of the main field are then read out in accordance with the selected read voltage group (S140).

Otherwise, when the page information stored in the flag cell FC4 is "1", it means that the memory cells of the main field store multi-bit data lower than four-bit data. Therefore, the read voltage adjuster 250 checks page information from the flag cell FC3 (S120). When the page information stored in the flag cell FC3 is "0", it means that the memory cells of the main field have been programmed up to the third page. Thus, the read voltage adjuster 250 executes the reading operation to the third index field HIF_3 in order to set the read voltage corresponding to the third page. For this, the page buffer 240 is reset and the memory cells of the third index field HIF_3 are sensed with reference to the index level HIL_3. The read voltage adjuster 250 counts fail bits from index data output as a result of the reading. According to the counted number of fail bits, the optimum group of the read voltages is selected for reading the third page data (S125). Data of the memory cells of the main field are then read out in accordance with the selected read voltage group (S140).

When the page information stored in the flag cells FC3 and FC4 is all "1s", it means that the memory cells of the main field store data lower than two-bit data. Therefore, the read voltage adjuster 250 checks the page information from the flag cell FC2 (S130). When the page information stored in the flag cell FC2 is "0", it means that the memory cells of the main field have been programmed up to the second page. Thus, the read voltage adjuster 250 executes the reading operation to the second index field HIF_2 in order to set the read voltage corresponding to the second page. For this, the page buffer 240 is reset and the memory cells of the second index field HIF_2 are sensed with reference to the index level HIL_2. The read voltage adjuster 250 counts fail bits from index data output as a result of the reading. According to the counted number of fail bits, the optimum group of the read voltages is selected for reading the second page data (S135). Data of the memory cells of the main field are then read out in accordance with the selected read voltage group (S140).

When the page information stored in the flag cells FC2~FC4 are all "1"s, it means that only the first page data are programmed in the main field. Thus, the read voltage adjuster 250 indicates that the first page data are programmed in the memory cells of the main field, and the page buffer 240 is controlled to externally output its latched data (S150).

Accordingly, the index field is read with reference to the page information of the flag cells corresponding to pages which are additionally provided for read-voltage adjustment. By counting the number of fail bits from the index field, the reading operation is conducted for the main field after selecting and setting the optimum read voltages. Through this read-voltage setting sequence, the flash memory device is able to provide reduced or minimum read error.

Figure 10:
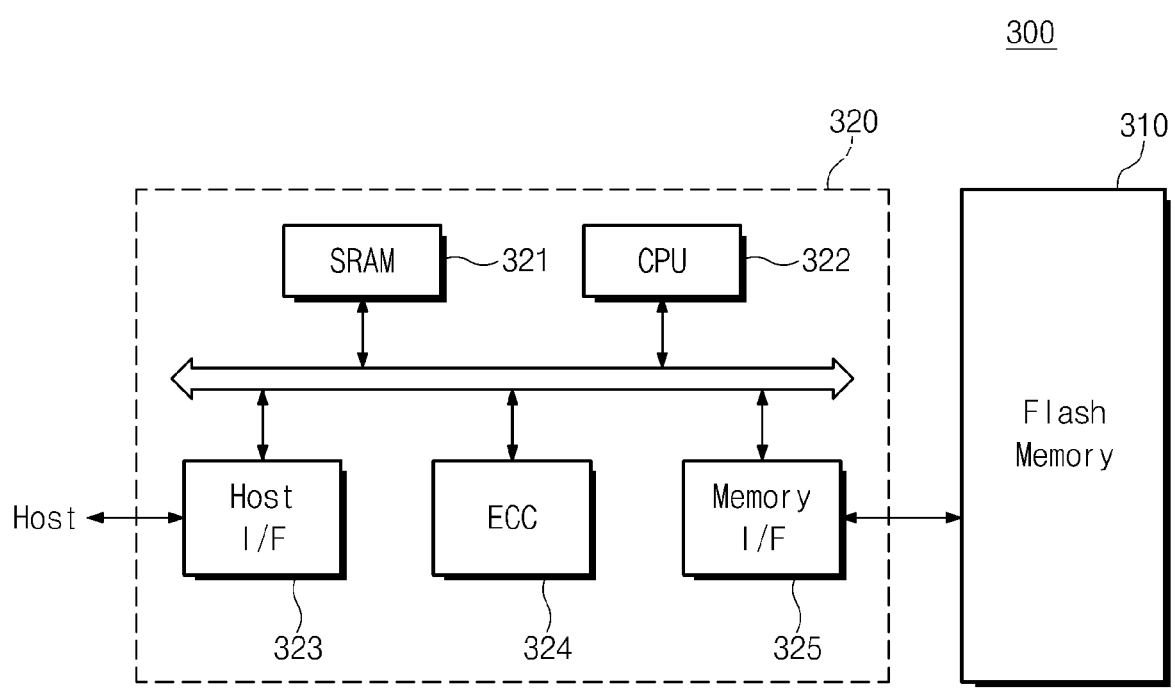
FIG. 10 is a block diagram of a memory system, according to an exemplary embodiment of the present invention.

FIG. 10 is a block diagram of a memory system 300, such as a memory card or solid state disk (SSD), including a multi-bit flash memory device 310, according to an exemplary embodiment of the present invention. The flash memory device 310 may be the same as that shown in FIG. 5, for example. Referring to FIG. 10, the memory system 300 supports large-capacity data storage. The memory system 300, according to the depicted embodiment, also includes a memory controller 320 for controlling overall operation of data exchanges between a Host and the flash memory device 310. The flash memory device 310 of the memory system 300 generates optimum read voltages corresponding to word lines and pages of the word lines, and conducts reading operations using the optimum read voltages. Accordingly, data read from the flash memory device 310 are output with a reduced error rate due to the adjusted read voltages, providing high reliability for the memory system 300.

A static random access memory (SRAM) may be used as an operation memory for central processing unit (CPU) or processor 322 of the memory controller 320. A host interface 323 includes a data exchange protocol of the Host connected to the memory card 300. An error check and correction (ECC) block 324 detects and corrects errors, for example, in data read from the multi-bit flash memory device 310. A memory interface 325 interfaces with the flash memory device 310. The processor 322 conducts a general operation for data exchange with the memory controller 320. Although not shown, it would be apparent to those skilled in the art that the memory system 300, e.g., a memory card, may further include a read-only memory (ROM), which may store code data for interface with the Host, for example.

In the memory system 300, read data having minimum error is output from the flash memory device 310. Any errors may be detected and corrected by the ECC block 324, although by reducing the read error, the flash memory device 310 lightens the burden on the ECC block 324.

Additionally, the memory system 300 can be configured to be an SSD. In this case, the operational burden of the ECC block 325 is further reduced with respect to error correction for the SSD. Thus, the memory system 300 is able to accomplish higher quality and faster reading operations. Although not shown, the memory system 300 may be provided as an information processing apparatus capable of exchanging large-capacity data, for example, by combining with an application chipset, a camera image process such as CMOS image sensor (CIS) or a mobile DRAM.

Figure 11:
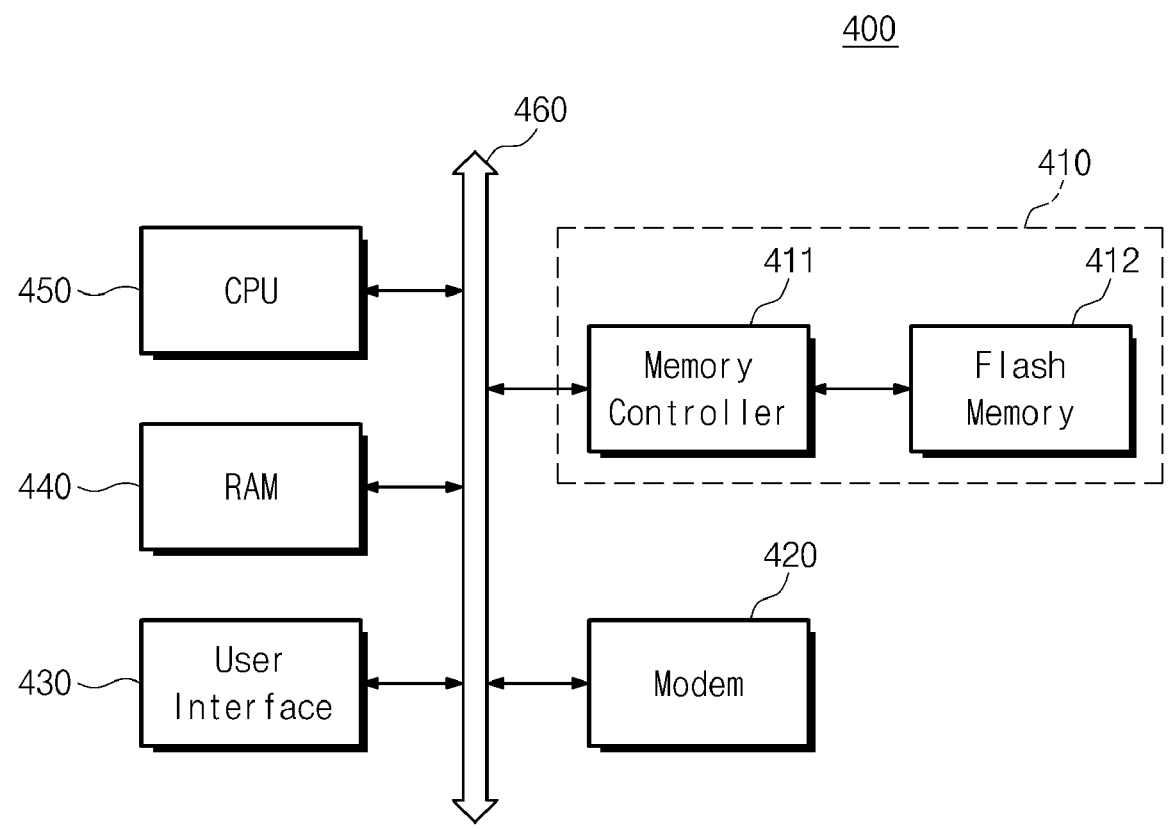
FIG. 11 is a block diagram of an information system, according to an exemplary embodiment of the present invention.

FIG. 11 is a block diagram of information processing system 400 equipped with a flash memory system 410, according to an exemplary embodiment of the present invention. Referring to FIG. 11, the flash memory system 410 is embedded in the information processing system 400, which may be a mobile apparatus or desktop computer, for example. The information processing system 400 includes a central processing unit (CPU) 450 electrically connected to the flash memory system 410, which includes a memory controller 411 and a flash memory device 412, by way of bus 460. RAM 440, user interface 430 and a modem 420 are likewise connected to the bus 460. The flash memory system 410 may be substantially structured as a memory card or flash memory system described above. The flash memory device 412 stores data, which are provided by the user interface 430 or by the CPU 450, through the memory controller 411.

The CPU 450 and other system components, corresponding to the host equipped with the flash memory system 410, may be supplied with very reliable data from the flash memory system 410. The flash memory system 410 can be organized as an SSD, in which case, the information processing system 400 may be supplied with data of high frequency and reliability, having a reduced error correction burden. Although not shown in FIG. 11, the system may be further equipped with an application chipset, a camera image processor (e.g., CIS), a mobile DRAM, etc.

The flash memory or the flash memory system may be mounted by way of various types of packages, including, for example, Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

As described above, the present invention provides a flash memory device or memory system capable of reducing and/or minimizing read errors by adjusting read voltages to compensate for threshold-voltage distribution shifts, e.g., due to HTS, by word lines and pages.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device, comprising:
   a cell array comprising a first field having a first plurality of memory cells and a second field having a second plurality of memory cells; and
   a read voltage adjuster for quantizing charge loss based on second data read from the second plurality of memory cells of the second field and adjusting a read voltage for reading first data from the first plurality of memory cells of the first field in accordance with the quantized charge loss, wherein the read voltage adjuster quantizes the charge loss by counting a number of bits corresponding to on-cells from the second data.

2. The flash memory device as set forth in claim 1, wherein the first plurality of memory cells and the second plurality of memory cells are connected to the same word line.

3. The flash memory device as set forth in claim 2, wherein the second plurality of memory cells of the second field are programmed in a highest state.

4. The flash memory device as set forth in claim 3, wherein the second plurality of memory cells of the second field are sensed by an index read voltage.

5. The flash memory device as set forth in claim 4, wherein the index read voltage is a verifying voltage for programming the second plurality of memory cells of the second field into the highest state.

6. The flash memory device as set forth in claim 1, wherein the read voltage adjuster adjusts the read voltage lower based on the number of bits corresponding to the on-cells.

7. The flash memory device as set forth in claim 1, wherein the first and second pluralities of memory cells are multi-level cells, each multi-level cell storing multi-bit data.

8. The flash memory device as set forth in claim 7, wherein the cell array further comprises a plurality of flag cells for indicating the number of bits stored in the first and second pluralities of memory cells.

9. The flash memory device as set forth in claim 8, wherein the first plurality of memory cells, the second plurality of memory cells and the plurality of flag cells are connected to the same word line.

10. The flash memory device as set forth in claim 9, wherein the second field comprises a plurality of index fields corresponding to pages of the multi-bit data.

11. The flash memory device as set forth in claim 10, wherein the second data are read out from the second plurality of memory cells belonging to one of the plurality of index fields in accordance with page information read by at least one flag cell.

12. The flash memory device as set forth in claim 11, wherein each of the index fields comprises memory cells, which are sensed by index read voltages having different levels.

13. The flash memory device as set forth in claim 1, further comprising:
   a high voltage generator configured to generate the read voltage.

14. A flash memory device, comprising:
   a plurality of memory cells, each of which is included in one of a main field, a spare field, and an index field of the same word line;

a page buffer connected to bit lines of the plurality memory cells;

a high voltage generator for providing a read voltage for a word line of the plurality of memory cells; and a read voltage adjuster for determining the read voltage for reading first data from the memory cells of the main field based on second data read from the memory cells of the index field of the same word line, and for setting the high voltage generator to generate the read voltage, wherein the read voltage adjuster counts a number of bits corresponding to on-cells using the second data read from the memory cells of the index field.

15. The flash memory device as set forth in claim 14, wherein the memory cells of the spare field comprise flag cells for storing page information indicating the number of pages programmed in the main field.

16. The flash memory device as set forth in claim 15, wherein the index field comprises a plurality of cell fields corresponding to the number of pages.

17. The flash memory device as set forth in claim 16, wherein the plurality of cell fields include memory cells of the index field, the memory cells of the plurality cell fields being sensed by index read voltages having different levels, respectively.

18. The flash memory device as set forth in claim 17, wherein the second data includes index data read from the memory cells of the plurality of cell fields corresponding to the page information.

19. The flash memory device as set forth in claim 16, wherein the index field is read with reference to the page information of the flag cells.

20. The flash memory device as set forth in claim 14, wherein the read voltage adjuster determines the read voltage in accordance with the counted number of bits.

21. The flash memory device as set forth in claim 20, wherein the read voltage adjuster adjusts the read voltage to be lower based on the number of bits.

22. The flash memory device as set forth in claim 14, further comprising:

a command register and control logic block for activating the read voltage adjuster in response to a read command.

23. A method of reading selected memory cells of a flash memory device, the method comprising:

reading index data from memory cells belonging to an index field that is associated with a main field of the selected memory cells by sensing the memory cells of the index field under an index read voltage;

counting a number of on-cells using the index data;

determining a level of a read voltage of the selected memory cells in accordance with the number of on-cells; and adjusting the read voltage of the selected memory cells with reference to the determined level.

24. The method as set forth in claim 23, wherein the on-cells are memory cells which have lower threshold-voltage than the index read voltage.

25. The method as set forth in claim 23, wherein the memory cells of the index field are programmed in the highest one of threshold-voltage states corresponding to multi-bit data.

26. The method as set forth in claim 25, wherein the index read voltage comprise a verifying voltage for the highest threshold-voltage state.

27. The method as set forth in claim 23, wherein the read voltage is adjusted to be lowered in accordance with a number of on-cells.

28. The method as set forth in claim 23, wherein the memory cells belonging to the index field and the main field are connected to a same word line.

29. The method as set forth in claim 23, further comprising:

reading memory cells belonging to the main field by the adjusted read voltage.

30. The method as set forth in claim 23, further comprising:

reading page information indicating a number of programmed pages of the selected memory cells from flag cells belonging to a spare field that is associated with the main field of the selected memory cells.

31. The method as set forth in claim 30, wherein in the reading index data, the memory cells of the index field are sensed by the index read voltage corresponding to the read page information.

* * * * *